United States Patent
Alter et al.

(10) Patent No.: US 8,525,257 B2
(45) Date of Patent: Sep. 3, 2013

(54) LDMOS TRANSISTOR WITH ASYMMETRIC SPACER AS GATE

(75) Inventors: Martin Alter, Los Altos, CA (US); Paul Moore, Belmont, CA (US)

(73) Assignee: Micrel, Inc., San Jose, CA (US)

( * ) Notice: Subject to any disclaimer, the term of this patent is extended or adjusted under 35 U.S.C. 154(b) by 934 days.

(21) Appl. No.: 12/592,011

(22) Filed: Nov. 18, 2009

(65) Prior Publication Data

US 2011/0115017 A1    May 19, 2011

(51) Int. Cl.
*H01L 29/423*   (2006.01)
*H01L 29/66*    (2006.01)
*H01L 29/78*    (2006.01)
*H01L 21/28*    (2006.01)

(52) U.S. Cl.
USPC ........... 257/335; 257/346; 257/341; 257/343; 438/286; 438/290

(58) Field of Classification Search
USPC ................. 257/369, 341, 335, 288, 327, 343; 438/286, 290
See application file for complete search history.

(56) References Cited

U.S. PATENT DOCUMENTS

| | | | | |
|---|---|---|---|---|
| 6,153,905 | A * | 11/2000 | Davies et al. | 257/320 |
| 2002/0005550 | A1 * | 1/2002 | Takahashi et al. | 257/335 |
| 2005/0285188 | A1 * | 12/2005 | Khemka et al. | 257/338 |
| 2010/0102388 | A1 * | 4/2010 | Levin et al. | 257/343 |
| 2010/0289085 | A1 * | 11/2010 | Yuan et al. | 257/369 |

FOREIGN PATENT DOCUMENTS

| | | |
|---|---|---|
| JP | 57024568 | 2/1982 |
| JP | 7307463 | 11/1995 |
| JP | 8017849 | 1/1996 |

* cited by examiner

*Primary Examiner* — Olik Chaudhuri
*Assistant Examiner* — Wilner Jean Baptiste
(74) *Attorney, Agent, or Firm* — Van Pelt, Yi & James LLP

(57) ABSTRACT

The present invention provides a laterally diffused metal oxide semiconductor (LDMOS) transistor and a method for fabricating it. The LDMOS transistor includes an n-type epitaxial layer formed on a p-type substrate, and an asymmetric conductive spacer which acts as its gate. The LDMOS transistor also includes a source and a drain region on either side of the asymmetric conductive spacer, and a channel region formed by ion-implantation on the asymmetric conductive spacer. The height of the asymmetric conductive spacer increases from the source region to the drain region. The channel region is essentially completely under the asymmetric conductive spacer and has smaller length than that of the channel region of the prior art LDMOS transistors. The LDMOS transistor of the present invention also includes a field oxide layer surrounding the active region of the transistor, and a thin dielectric layer isolating the asymmetric conductive spacer from the n-type epitaxial layer.

9 Claims, 11 Drawing Sheets

LDMOS TRANSISTOR WITH ASYMMETRIC SPACER AS GATE

FIELD OF THE INVENTION

The present invention relates, in general, to a laterally diffused metal oxide semiconductor (LDMOS) transistor and, more specifically, to an LDMOS transistor having an asymmetrical conductive spacer acting as a gate.

BACKGROUND

An LDMOS transistor conventionally includes an electrically conductive gate enclosed between two electrically insulating spacers, a source region, a drain region, a channel region, and a drift region. A positive potential is applied to the gate, which causes the flow of electrons from the source region to the drain region through the channel region of the LDMOS transistor. Due to the insulating nature of the spacers, they do not act as part of the gate, and the gate voltage can be applied only through the gate and not through the spacers.

A conventional LDMOS transistor 100, as described above, is illustrated in FIG. 1. LDMOS transistor 100 includes an n-type buried layer 104 formed on a p-type substrate 102. An n-type epitaxial layer 106 is grown on n-type buried layer 104, and field oxide layers 108a and 108b are formed on n-type epitaxial layer 106 to define the active region of LDMOS transistor 100. Typically, the active region of LDMOS transistor 100 is the region on n-type epitaxial layer 106 where LDMOS transistor 100 is being fabricated or formed.

LDMOS transistor 100 also includes a p-well 110 in which a source region 112 is formed. P-well 110 can be formed through ion implantation or diffusion of any p-type element such as boron. Similarly, the source region 112 can also be formed through ion implantation or diffusion of any n-type element such as arsenic. Similar arsenic implantation can be used to form a drain region 114 of LDMOS transistor 100.

Further, LDMOS transistor 100 includes a gate 116, for example, a polysilicon gate that is partially over n-type epitaxial layer 106 and partially over p-well 110. As shown in FIG. 1, gate 116 is isolated from n-type epitaxial layer 106 and p-well 110 by a thin dielectric layer 118, which can be, for example, a thin silicon oxide (SiO2) layer. Further, on the sidewalls of gate 116, spacers 120a and 120b are formed. These spacers are non-conductive in nature and can be formed by using dielectric material such as silicon oxide (SiO$_2$) or nitride. Those ordinarily skilled in the art will appreciate that the region under the spacers is lightly doped N-region, commonly known as NLDD (n-type lightly doped diffusion), but is not shown for simplicity.

Typically, whenever a preset positive gate voltage is applied at gate 116, electrons (minority carriers) present in p-well 110 are attracted toward gate 116, and consequently a channel region 122 is formed. Channel region 122 connects source region 112 to drift region 124 of LDMOS transistor 100. When drain-to-source voltage (not shown in FIG. 1) is applied to LDMOS transistor 100, the electrons present in source region 112 travel through channel region 122 and drift region 124 to drain region 114, thus enabling the flow of electrons from the source to the drain in LDMOS transistor 100.

Conventional LDMOS transistor 100, as described above, has the limitation of high parasitic capacitance and channel resistance. The parasitic capacitance of LDMOS transistor 100 is due to the "capacitor" formed between gate 116 and channel region 122. The value of the parasitic capacitance is directly related to the product of the width (not shown in FIG. 1) and the length of channel region 122. Further, the channel resistance of LDMOS transistor 100 is due to the resistance offered by channel region 122, and its value is also related to the length and the width of channel region 122.

The high parasitic capacitance and channel resistance of LDMOS transistor 100 causes the RC constant of LDMOS transistor 100 to increase, and hence the time required for charging and discharging of parasitic gate capacitor of LDMOS transistor 100 also increases. This hampers the performance of LDMOS transistor 100, and the speed of the circuit which utilizes it also decreases. Therefore, continuous efforts are being made to reduce the parasitic capacitance and channel resistance of LDMOS transistor 100.

To overcome the above-mentioned problems, the present invention provides an LDMOS transistor that has much lower channel resistance and parasitic capacitance than that of the prior art LDMOS transistors. A method to fabricate the said LDMOS transistor is also provided.

SUMMARY OF THE INVENTION

According to an embodiment of the present invention, a method for fabricating an LDMOS transistor is provided. The method includes forming a semiconductor layer of a first conductivity type on a semiconductor substrate. The semiconductor layer is, for example, an epitaxial layer and the first conductivity type is n-type conductivity. In accordance with an embodiment of the present invention, the n-type epitaxial layer is separated from the semiconductor substrate by an n-type buried layer.

The method further includes forming a dielectric layer on the semiconductor layer. The dielectric layer can be, for example, a thin silicon oxide (SiO$_2$) layer formed on the semiconductor layer. The method also includes forming an asymmetrical conductive spacer on the semiconductor layer. The asymmetrical conductive spacer acts as a gate of the LDMOS transistor and is insulated from the semiconductor layer by the dielectric layer. In accordance with an embodiment of the present invention, the asymmetrical conductive spacer divides the semiconductor layer into two regions, a first region and a second region, and the shape of the asymmetrical conductive spacer is such that the height of the asymmetrical conductive spacer increases from the first region to the second region. Furthermore, the method includes etching the dielectric layer to remove portions of the dielectric layer from the first region and the second region.

The method also includes forming a field oxide layer on the semiconductor layer and then etching the field oxide layer to define the active region of the LDMOS transistor. In other words, the field oxide layer is etched in such a way that it surrounds the area of the semiconductor layer where the LDMOS transistor is being fabricated. Those ordinarily skilled in the art will understand that the process of forming the field oxide layer to define the active region of the LDMOS transistor is well known in the art. Also, the field oxide layer can be formed before the formation of the dielectric layer and the asymmetrical conductive spacer, without departing from of the scope of the present invention.

Once the active region of the LDMOS transistor is defined, a first implantation is performed on the first region of the semiconductor layer by using a first type of dopant of a second conductivity. The first implantation is done to form a well of the second conductivity type in the first region of the semiconductor layer. In accordance with an embodiment of the present invention, the second conductivity type is p-type conductivity and the first type of dopant is boron. Also, the first implantation is performed by using the first energy of implantation, which can be for example 50 kv, and a typical dosage implant is in the range of $10^{12}$-$10^{13}$/cm$^3$. The method includes performing a second implantation by using a second type of dopant of the first conductivity type to form a source region and a drain region of the LDMOS transistor. The second type of dopant can be, for example, any one of arsenic or phosphorous or both. The source region is formed such that it is partially in the well of the second conductivity type and partially underneath the asymmetric conductive spacer.

Furthermore, the method includes performing a third implantation by using a third type of dopant of the second conductivity type on the asymmetric conductive spacer to form a channel region of the LDMOS transistor. The channel region is formed in the semiconductor layer and is completely under the asymmetric conductive spacer. In accordance with an embodiment of the present invention, the third type of dopant is boron, and the third implantation is performed using the second energy of implantation, which can be for example 50 kv, and the dosage implant can be, for example in the range of $10^{13}$-$10^{14}$/cm$^3$. In another embodiment, this region can be formed by a combination of boron and phosphorous with both in the same range of doping concentration.

According to another embodiment of the present invention, an LDMOS transistor is provided. The LDMOS transistor includes a semiconductor layer of a first conductivity type formed on a semiconductor substrate. Further, the LDMOS transistor includes an asymmetric conductive spacer formed on the semiconductor layer which acts as its gate and is insulated from the semiconductor layer by a thin dielectric layer. In accordance with an embodiment of the present invention, the asymmetric conductive spacer divides the semiconductor layer into two regions, a first region and a second region; and the height of the asymmetric conductive spacer increases from the first region to the second region.

Further, the LDMOS transistor includes a well of a second conductivity type and a source region of the first conductivity type, which is partially in the well and partially underneath the asymmetric conductive spacer. The source region is formed in the first region of the semiconductor layer.

The LDMOS transistor further includes a drain region which is formed in the second region of the semiconductor layer, and a channel region which is formed in the semiconductor layer. The channel region is completely under the asymmetric conductive spacer. In accordance with an embodiment of the present invention, the channel region and the drain region are separated by a drift region of the first conductivity type. The LDMOS transistor also includes a field oxide layer surrounding the active region of the LDMOS transistor.

According to yet another embodiment of the present invention, a power field effect transistor (FED) is provided. The power FET includes a semiconductor layer of a first conductivity type formed on a semiconductor substrate. As already mentioned, the semiconductor layer is an epitaxial layer and the first conductivity type is n-type. The power FET further includes a plurality of asymmetric conductive spacers formed on the semiconductor layer. The plurality of asymmetric conductive spacers act as a gate of the power FET and are insulated from the semiconductor layer by a thin dielectric layer. Further, the height of each asymmetric conductive spacer increases from source region to drain region of the power FET.

Further, the power FET includes a plurality of wells of a second conductivity type formed in the semiconductor layer and a plurality of source regions of the power FET of the first conductivity type. Each source region of the power FET is partially in the well of the second conductivity type and partially underneath one or more asymmetric conductive spacers of the plurality of asymmetric conductive spacers. The power FET also includes a plurality of drain regions of the first conductivity type formed in the semiconductor layer and a plurality of channel regions of the second conductivity type formed in the semiconductor layer corresponding to the plurality of asymmetric conductive spacers. Each channel region of the plurality of channel regions is completely under the asymmetric conductive spacers of the power FET.

In accordance with an embodiment of the present invention, the asymmetric conductive spacers are connected in pairs. Each pair of the asymmetric conductive spacers forms a frame structure outside the active region of the power FET. Also, the pairs of asymmetric conductive spacers are connected to each other through a conductive material outside the active region of the power FET. The conductive material can be, for example, poly silicon.

Apart from the components mentioned above, the power FET also includes a field oxide layer surrounding the active area of the power FET and the plurality of drift regions separating the plurality of drain regions and the plurality of channel regions.

One objective of the present invention is to provide an LDMOS transistor with lower parasitic capacitance and channel resistance than those of the prior art LDMOS transistors. To this end, the length of the effective channel region of the LDMOS transistor is reduced by performing ion-implantation on an asymmetric conductive spacer acting as a gate.

Another objective of the present invention is to provide a method to fabricate an LDMOS transistor, which has lower parasitic capacitance and channel resistance than those of the prior art LDMOS transistors.

Yet another objective of the present invention is to provide an LDMOS transistor in which the entire channel region is underneath the asymmetric conductive spacer (which acts as a gate in the present invention) of the LDMOS transistor.

Another objective of the present invention is to provide a power FET that has a frame gate structure, with asymmetric conductive spacers acting as its gate. The frame gate structure reduces the width of the gate, thereby decreasing the parasitic capacitance and channel resistance of the power FET.

BRIEF DESCRIPTION OF THE DRAWINGS

The preferred embodiments of the invention will hereinafter be described in conjunction with the appended drawings provided to illustrate and not to limit the invention, wherein like designations denote like elements, and in which.

DETAILED DESCRIPTION OF THE INVENTION

Figure 1:
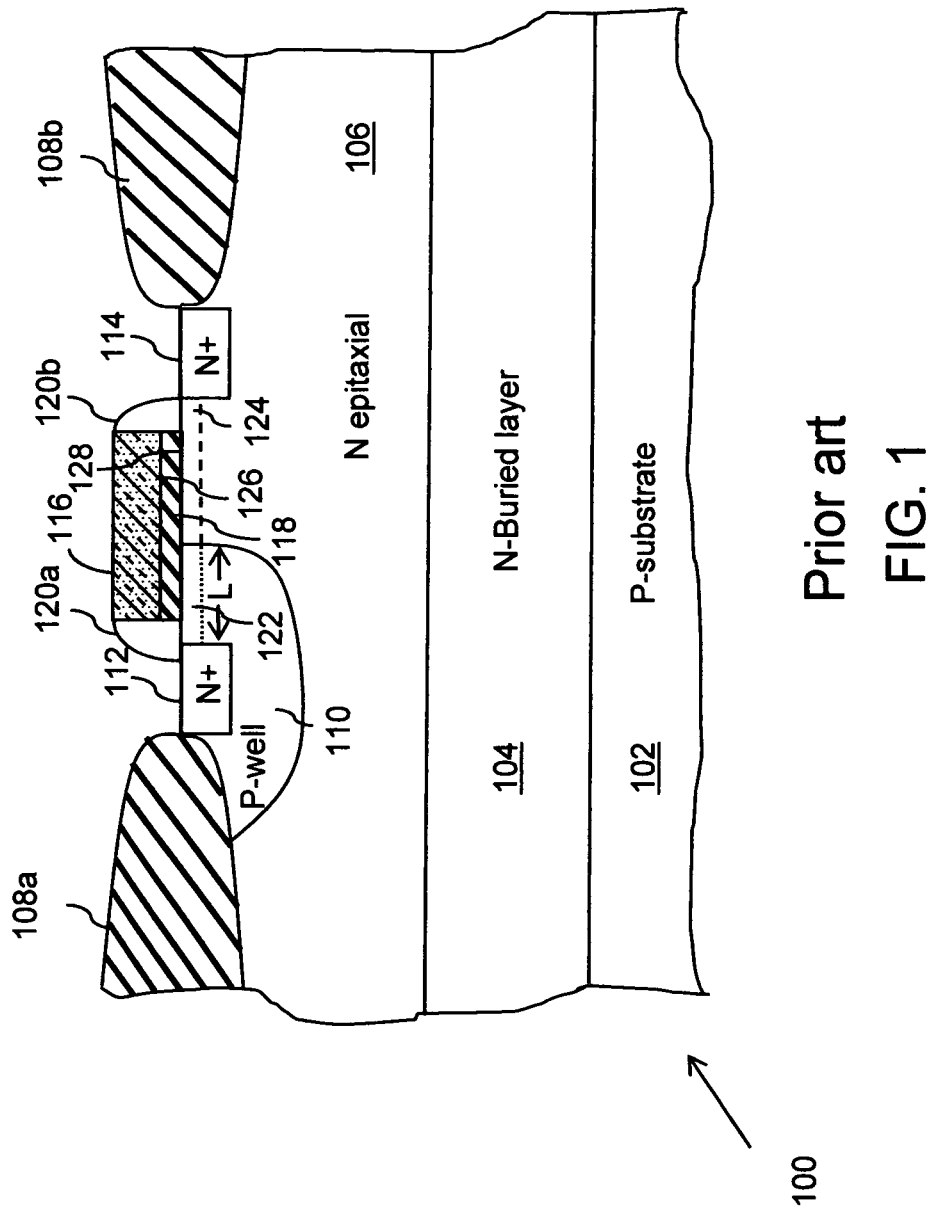
FIG. 1 illustrates a cross-sectional view of a prior art LDMOS transistor.
Figure 2:
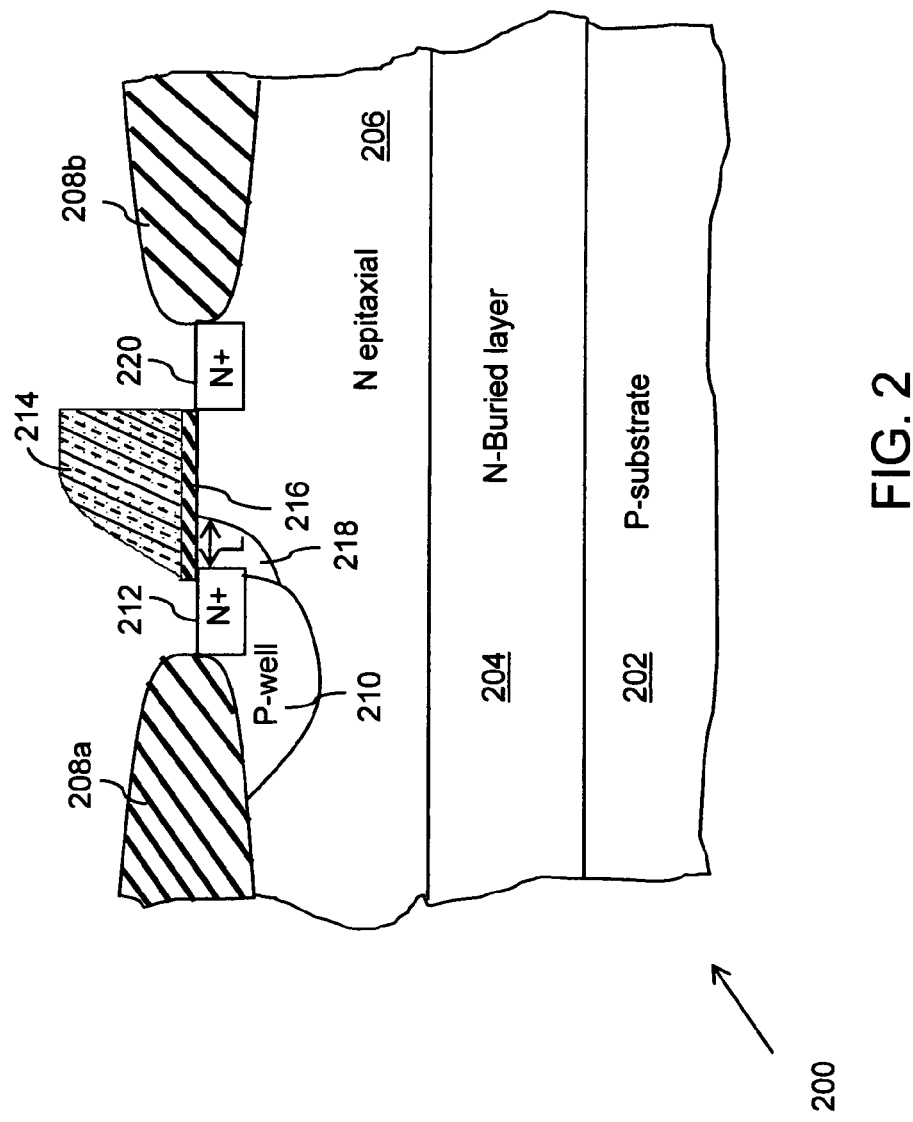
FIG. 2 illustrates a cross-sectional view of an LDMOS transistor, in accordance with an embodiment of the present invention.

FIG. 2 illustrates a cross-sectional view of an LDMOS transistor 200, in accordance with an embodiment of the present invention. LDMOS transistor 200 includes an n-type epitaxial layer 206 formed over a p-type substrate 202. N-type epitaxial layer 206 is separated from p-type substrate 202 by an n-type buried layer 204.

The active region of LDMOS transistor 200 is surrounded by a field oxide (FOX) layer 208a, 208b, which is generally formed to isolate LDMOS transistor 200 from other devices (not shown) formed on p-type substrate 202. Essentially, field oxide layer 208a, 208b defines the area where LDMOS transistor 200 is fabricated.

LDMOS transistor 200 further includes a p-well 210 formed in n-type epitaxial layer 206 and a source region 212 formed partially in p-well 210. P-well 210 can be formed by using any p-type dopant such as boron, and source region 212 can be formed by using an n-type dopant such as arsenic. Further, LDMOS transistor 200 includes an asymmetric conductive spacer 214, which is isolated from n-type epitaxial layer 206 by a thin dielectric layer 216.

In accordance with an embodiment of the invention, the height of asymmetric conductive spacer 214 is thinner toward source region 212, as shown in FIG. 2. The shape of asymmetric conductive spacer 214 is designed to facilitate the formation of a channel region 218 that is of much smaller length than the prior art LDMOS transistors. Channel region 218 is formed when ion-implantation is performed on asymmetric conductive spacer 214. According to an embodiment of the present invention, the entire channel region 218 is underneath asymmetric conductive spacer 214. The process of formation of channel region 218 and all steps involved in fabricating LDMOS transistor 200 will be described in conjunction with FIG. 3.

LDMOS transistor 200 further includes a drain region 220 having n-type conductivity and typically having the same doping level as that of source region 212.

The operation of LDMOS transistor 200 will now be described briefly, assuming that a positive drain-to-source voltage and gate voltage is applied to LDMOS transistor 200. In the present invention, asymmetric conductive spacer 214 acts as a gate of LDMOS transistor 200, and the gate voltage is applied to asymmetric conductive spacer 214 through gate contacts (not shown). When a preset positive voltage is applied to asymmetric conductive spacer 214, electrons from source region 212 move through channel region 218 to drain region 220. The region between channel region 218 and drain region 220 is called a drift region, and electrons pass through this region with the help of "drift" attained by them due to the potential difference between the drain and the source regions.

The process of fabricating LDMOS transistor 200 in accordance with one embodiment will now be described in conjunction with FIGS. 3-11.

Figure 3:
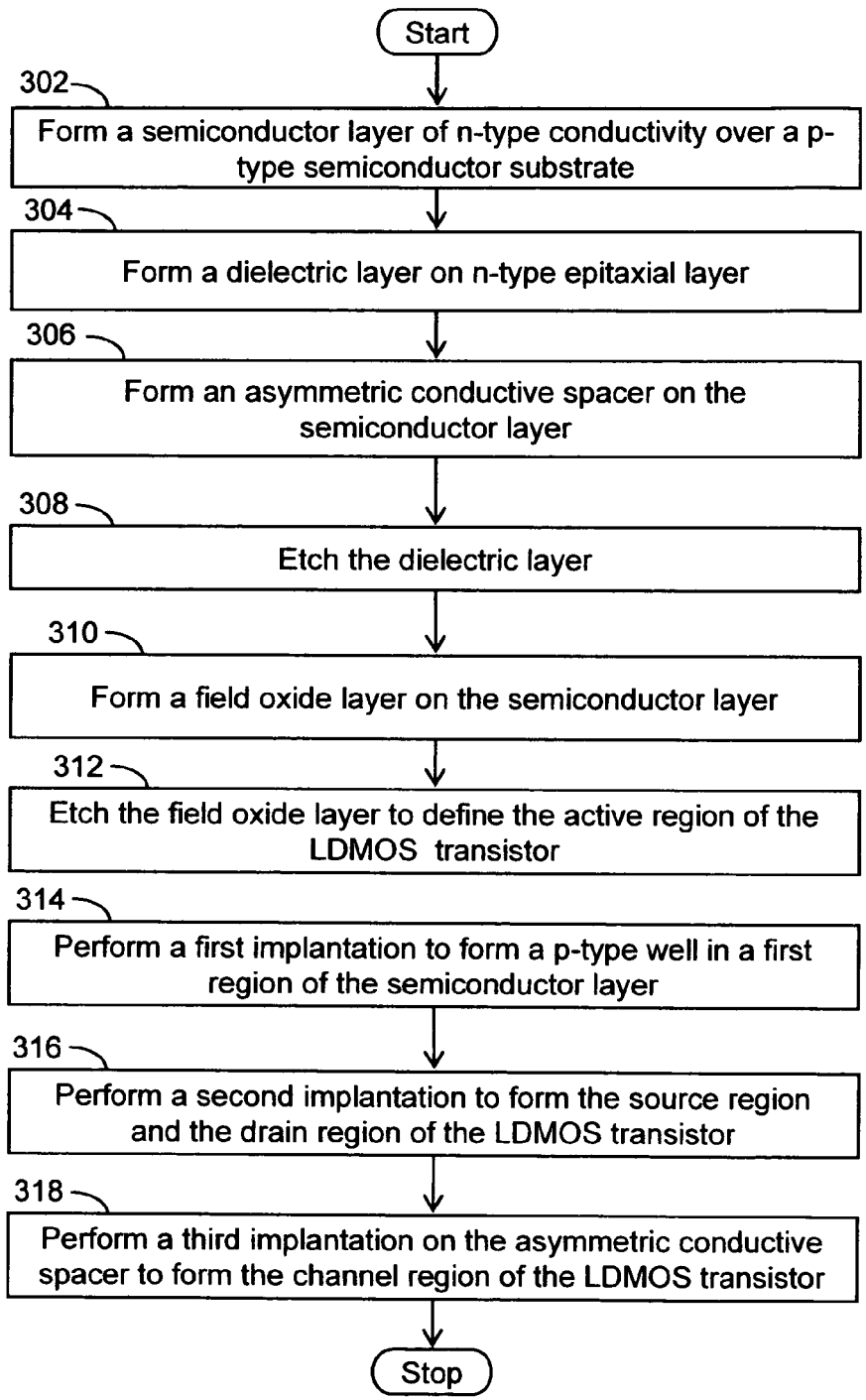
FIG. 3 is a flowchart illustrating a method for fabricating the LDMOS transistor, in accordance with an embodiment of the present invention.

FIG. 3 is a flowchart illustrating a method for fabricating LDMOS transistor 200, in accordance with an embodiment of the present invention. While describing FIG. 3, references will be made to FIGS. 4-11 to illustrate different steps in the formation of LDMOS transistor 200.

Figure 4:
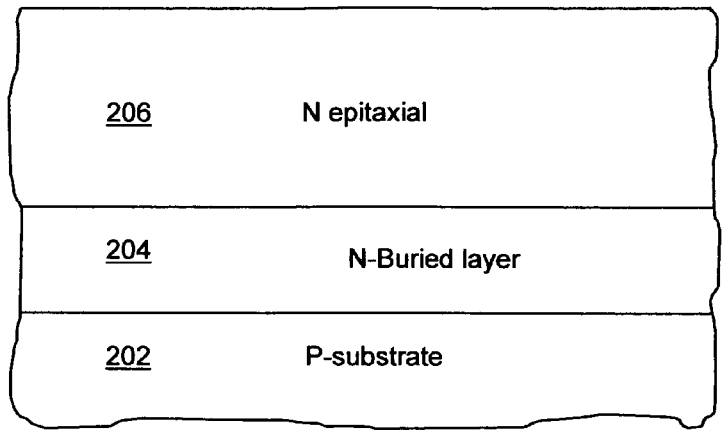
FIG. 4 is a cross-sectional view of a semiconductor structure illustrating an epitaxial layer grown over a semiconductor substrate, in accordance with an embodiment of the present invention.

At step 302, a semiconductor layer of n-type conductivity is formed over a p-type semiconductor substrate. As already explained in conjunction with the previous figure and as shown in FIG. 4, the said semiconductor layer is n-type epitaxial layer 206 formed over p-type substrate 202. In accordance with an embodiment of the present invention, n-type epitaxial layer 206 is separated from p-type substrate 202 by n-type buried layer 204.

Figure 5:
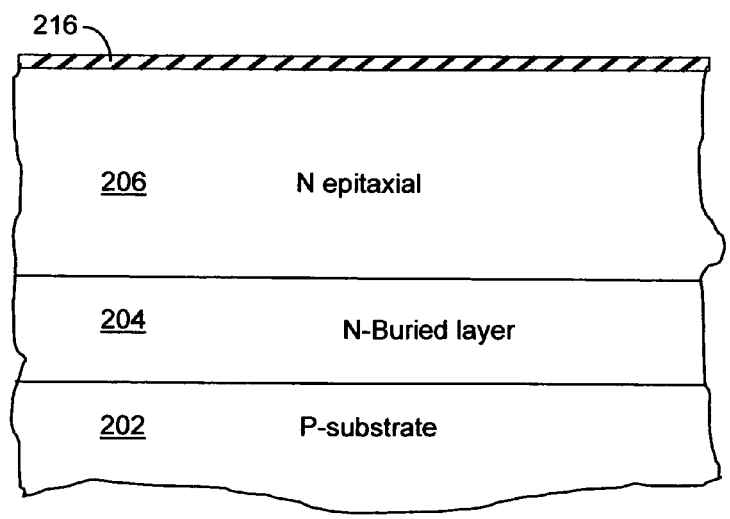
FIG. 5 is a cross-sectional view of the semiconductor structure illustrating a thin dielectric layer formed on the epitaxial layer, in accordance with an embodiment of the present invention.

At step 304, dielectric layer 216 is formed on n-type epitaxial layer 206, as shown in FIG. 5. Typically, dielectric layer 216 is a thin silicon oxide ($SiO_2$) layer. At step 306, asymmetric conductive spacer 214 is formed over n-type epitaxial layer 206 in such a way that it is separated from it by dielectric layer 216 (as shown in FIG. 6).

In accordance with an embodiment of the present invention, asymmetric conductive spacer 214 is formed by using a lift-off process, i.e., by using a sacrificial layer of oxide or nitride, which is removed after the formation of asymmetric conductive spacer 214. The process of using sacrificial materials to create structures on semiconductor substrates is well known in the art and will not be described here. Those ordinarily skilled in the art can appreciate that asymmetric conductive spacer 214 can also be formed by using a simple etching process, instead of the lift-off process as mentioned above, without departing from the scope of the invention.

Figure 6:
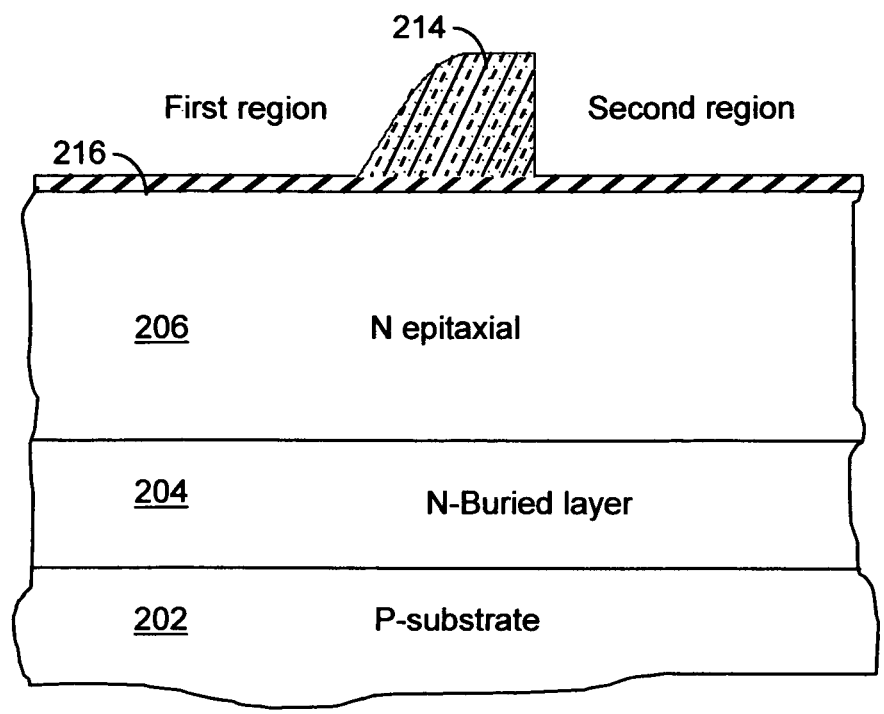
FIG. 6 is a cross-sectional view of the semiconductor structure illustrating an asymmetric conductive spacer formed on the thin dielectric layer, in accordance with an embodiment of the present invention.
Figure 7:
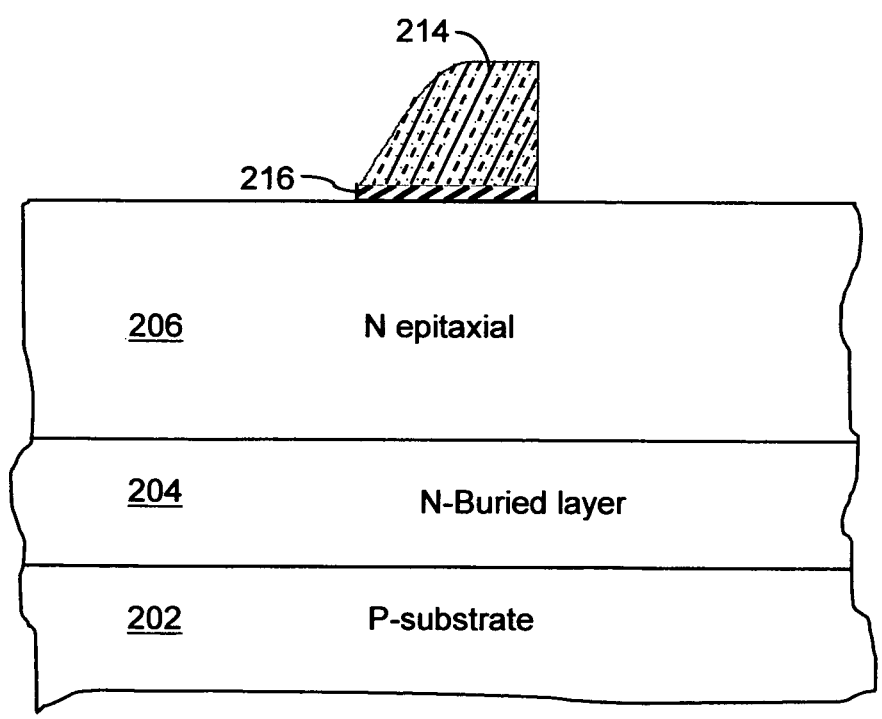
FIG. 7 is a cross-sectional view of the semiconductor structure illustrating the etched dielectric layer, in accordance with an embodiment of the present invention.

As shown in FIG. 6, asymmetric conductive spacer 214 divides n-type epitaxial layer 206 into two regions, a first region and a second region, and at step 308, dielectric layer 216 is etched from the first region and the second region so that it remains only underneath asymmetric conductive spacer 214 (as shown in FIG. 7).

Figure 8:
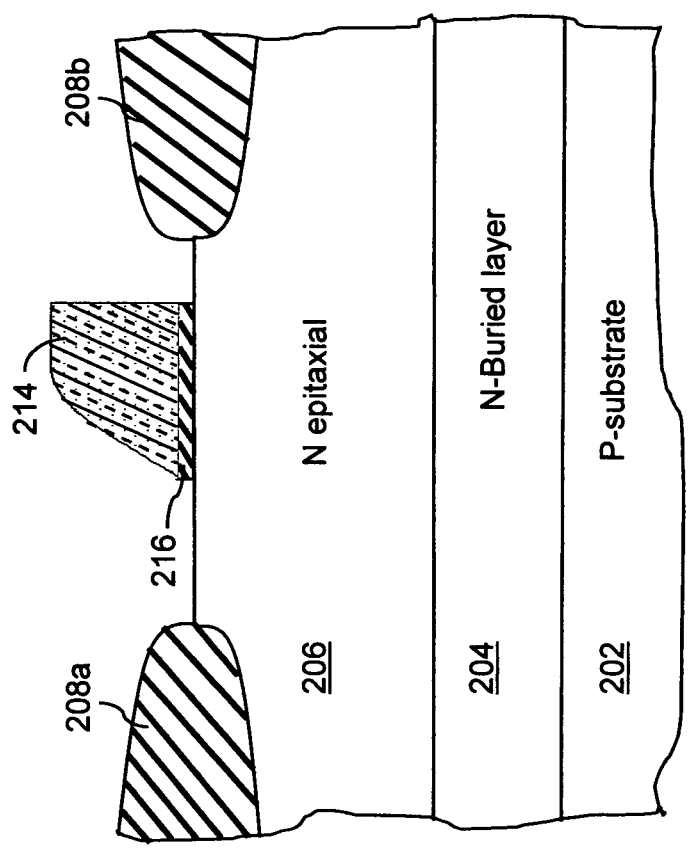
FIG. 8 is a cross-sectional view of the semiconductor structure illustrating a field oxide layer defining the active region of the LDMOS transistor, in accordance with an embodiment of the present invention.

At step 310, a field oxide layer is formed on n-type epitaxial layer 206, and at step 312, the field oxide layer is etched to define the active region of LDMOS transistor 200. This is shown in FIG. 8, where the etched field oxide layer is depicted as field oxide layer 208a, 208b. A typical process to prepare field oxide layer 208a, 208b is to first form a thick oxide layer on n-type epitaxial layer 206 (including asymmetric conductive spacer 214) and then etch the oxide layer from those regions where LDMOS transistor 200 is to be formed. In this way, field oxide layer 208a, 208b will surround the area of n-type epitaxial layer 206 where LDMOS transistor 200 is formed, thereby isolating it from other devices formed on the same p-type substrate 202.

Figure 9:
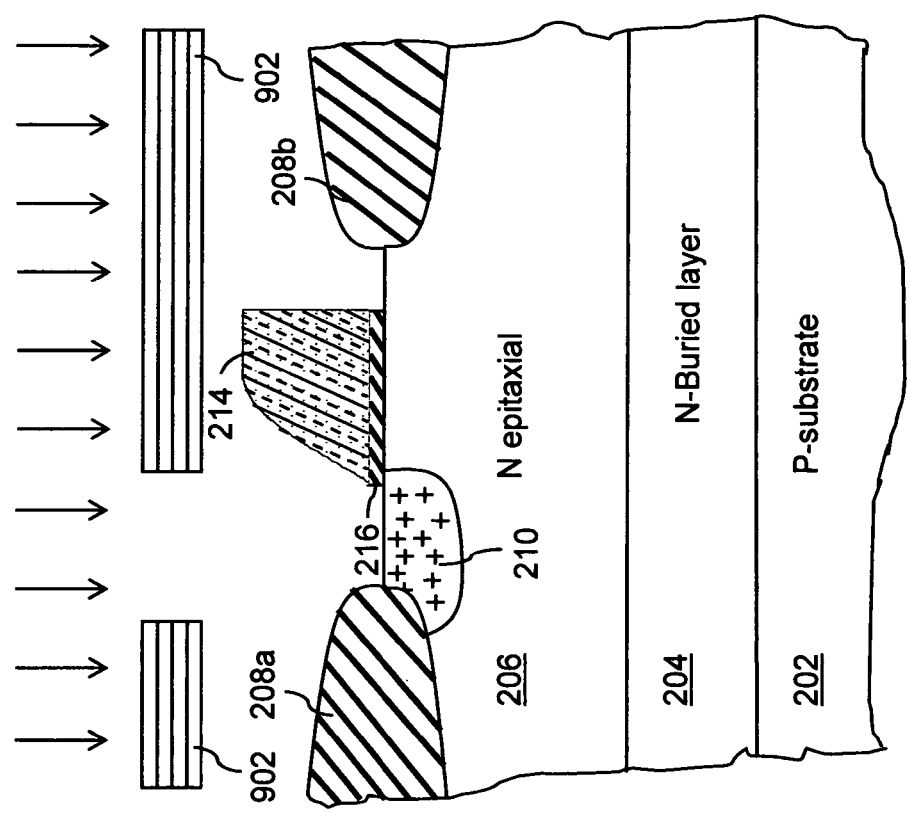
FIG. 9 is a cross-sectional view of the semiconductor structure illustrating the formation of a p-well by using a first ion implantation, in accordance with an embodiment of the present invention.

At step 314, a first implantation is performed to form p-well 210 in the first region of n-type epitaxial layer 206. In accordance with an embodiment of the present invention, the energy of the first implantation is 50 kv and the dosage implant is in the range of $10^{12}$ to $10^{13}/cm^3$. Typically, the dopant used for the implantation is boron. Typically, the first implantation is performed by using a mask 902, which masks all the regions on n-type epitaxial layer 206, except the region where p-well 210 is being formed (as shown in FIG. 9).

Figure 10:
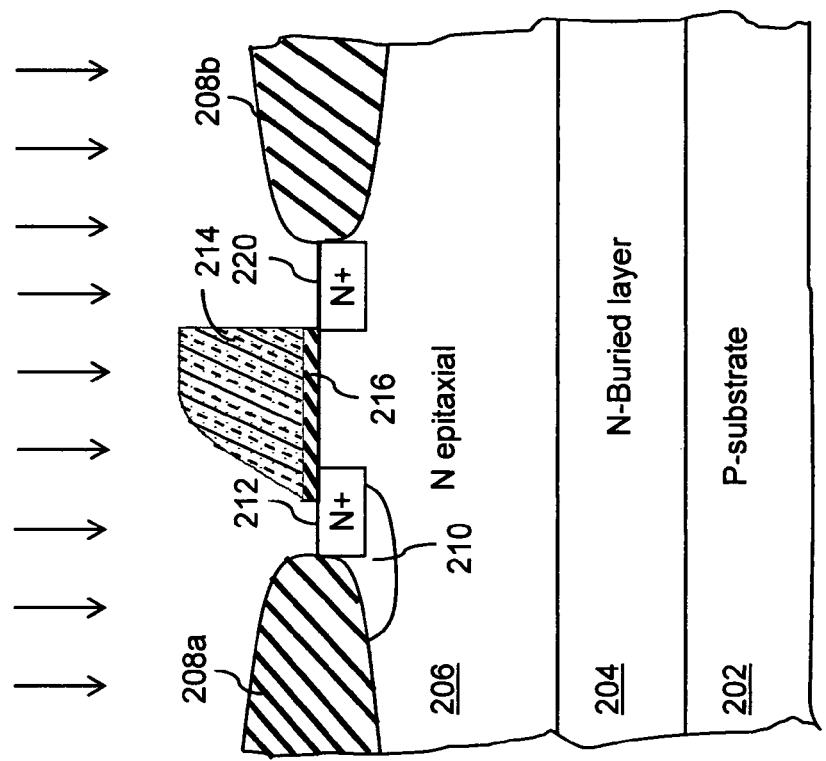
FIG. 10 is a cross-sectional view of the semiconductor structure illustrating the formation of the source region and the drain region of the LDMOS transistor by using a second ion implantation, in accordance with an embodiment of the present invention.

At step 316, a second implantation is performed to form source region 212 and drain region 220 of LDMOS transistor 200. FIG. 10 shows the process of implantation done to form source region 212 and drain region 220. Typically, the energy of the implantation is 50 kv. Dopant arsenic or phosphorous or both is used in the n-type second implantation to form the source and drain region. As shown in FIG. 10, source region 212 is formed in such a way that it is partially underneath asymmetric conductive spacer 214 due to the slope of the spacer and partially in p-well 210.

Figure 11:
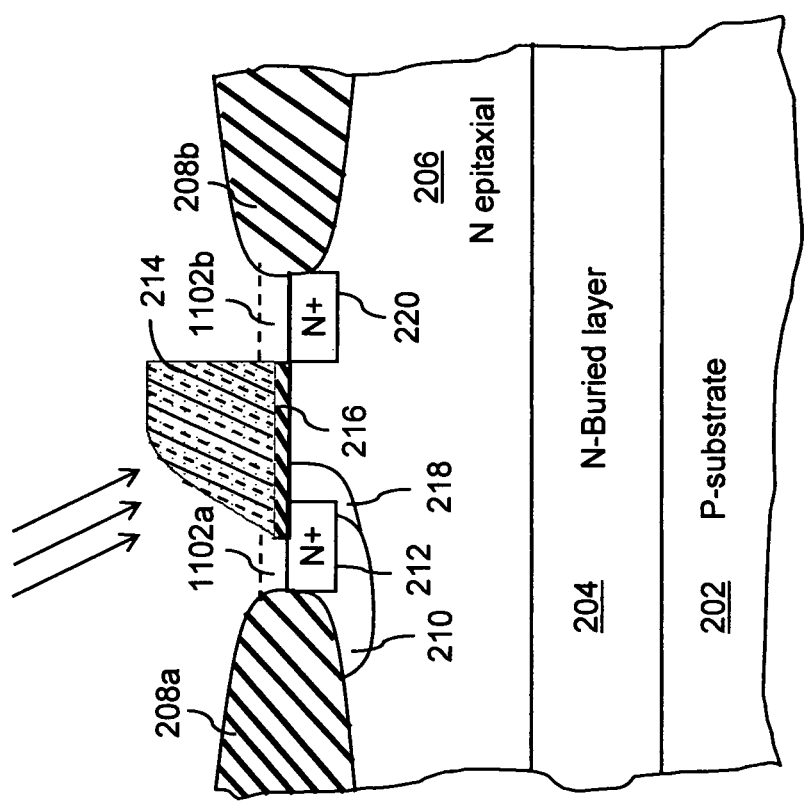
FIG. 11 is a cross-sectional view of the semiconductor structure illustrating the formation of the channel region of the LDMOS transistor by using a third ion implantation, in accordance with an embodiment of the present invention.

At step 318, a third implantation is performed on asymmetric conductive spacer 214 to form channel region 218 of LDMOS transistor 200. As depicted in FIG. 11 and according to one embodiment of the present invention, the third implantation is a halo (i.e., slant) ion-implantation and the energy of the implantation is 50 kv. The dopant used for the third implantation is similar to that used for the first implantation, i.e., boron. However, those ordinarily skilled in the art can appreciate that channel region 218 can also be formed by using any other p-type dopant such as gallium or indium. In accordance with an embodiment of the present invention, the halo ion-implantation is performed after the formation of an oxide layer 1102a, 1102b over the source and drain region of LDMOS transistor 200. Oxide layer 1102a, 1102b "masks" the source and drain region of LDMOS transistor 200 and therefore the ions used for the third implantation do not penetrate into these regions. However, the ions penetrate the sloped portion of the spacer 214 in order to form the channel region 218. Essentially, the formation of oxide layer 1102a, 1102b eliminates the need for providing a separate mask while channel region 218 is being formed. After channel region 218 is formed, oxide layer 1102a, 1102b is etched resulting in the LDMOS transistor shown in FIG. 2.

Those ordinarily skilled in the art will appreciate that channel region 218 can also be formed by using normal ion-implantation (rather than halo-ion implantation). In this case, the thickness of oxide layer 1102a, 1102b is chosen such that ions penetrate through the thinner region of asymmetric conductive spacer 214, but do not penetrate the source and drain regions through oxide layer 1102a, 1102b.

Since the height of asymmetric conductive spacer 214 is thinner toward source region 212, the shape of the formed channel region 218 is such that it is thicker toward p-well 210 and its depth decreases sharply away from p-well 210. This is due to the fact that during the process of implantation, the ions penetrate more deeply toward the thinner edge of asymmetric conductive spacer 214, and hence, the depth of channel region 218 is deeper toward p-well 210. As the height of asymmetric conductive spacer 214 increases from source region 212 to drain region 220, the depth of channel region 218 decreases away from source region 212 (and p-well 210) as the ion penetration decreases. Further, due to the fact that ion implantation is performed on asymmetric conductive spacer 214, the formed channel region 218 is essentially completely underneath asymmetric conductive spacer 214 (which is the gate of LDMOS transistor 200).

Figure 12:
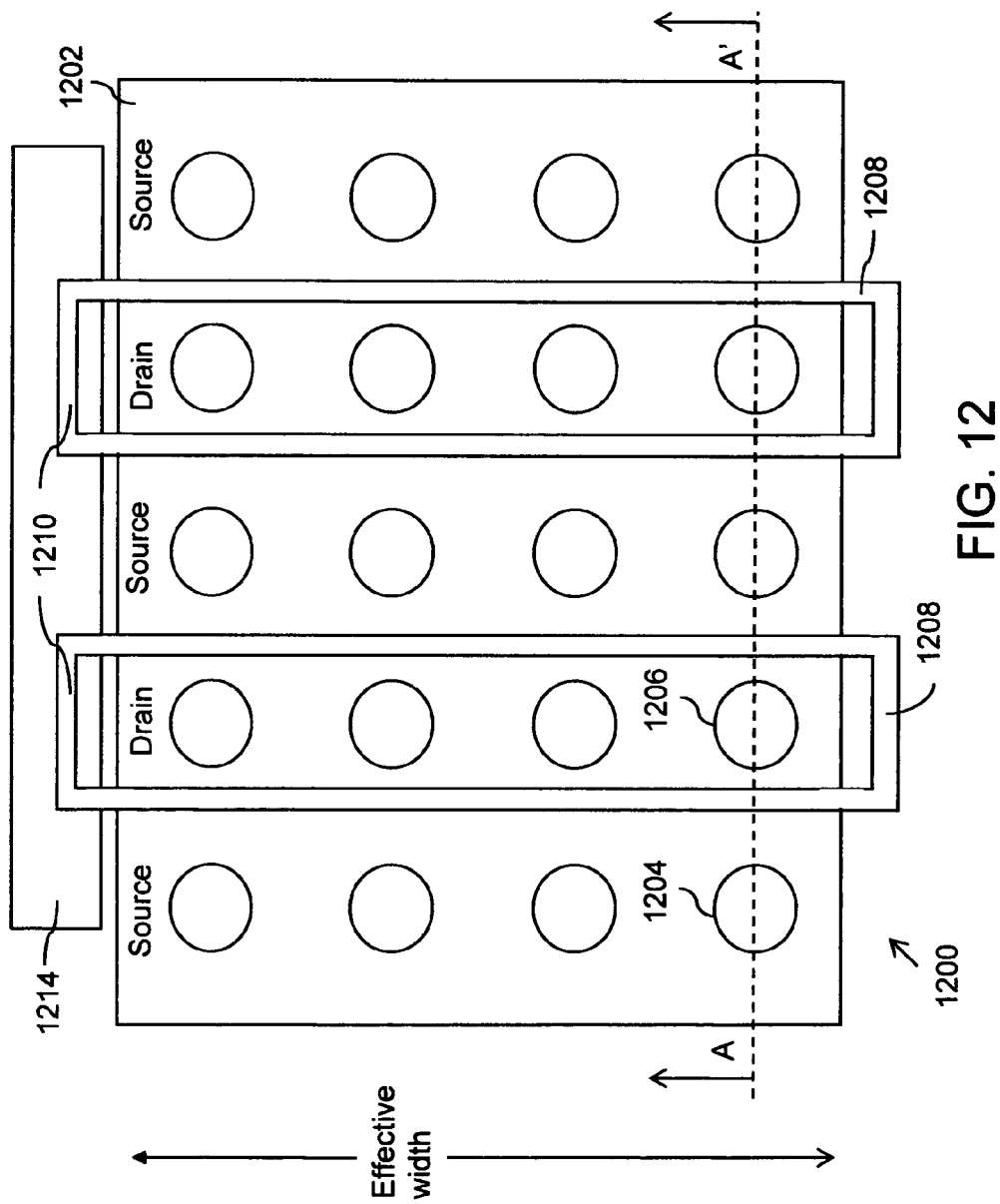
FIG. 12 illustrates a top view of a power FET with frame gate structure, in accordance with an embodiment of the present invention.
Figure 13:
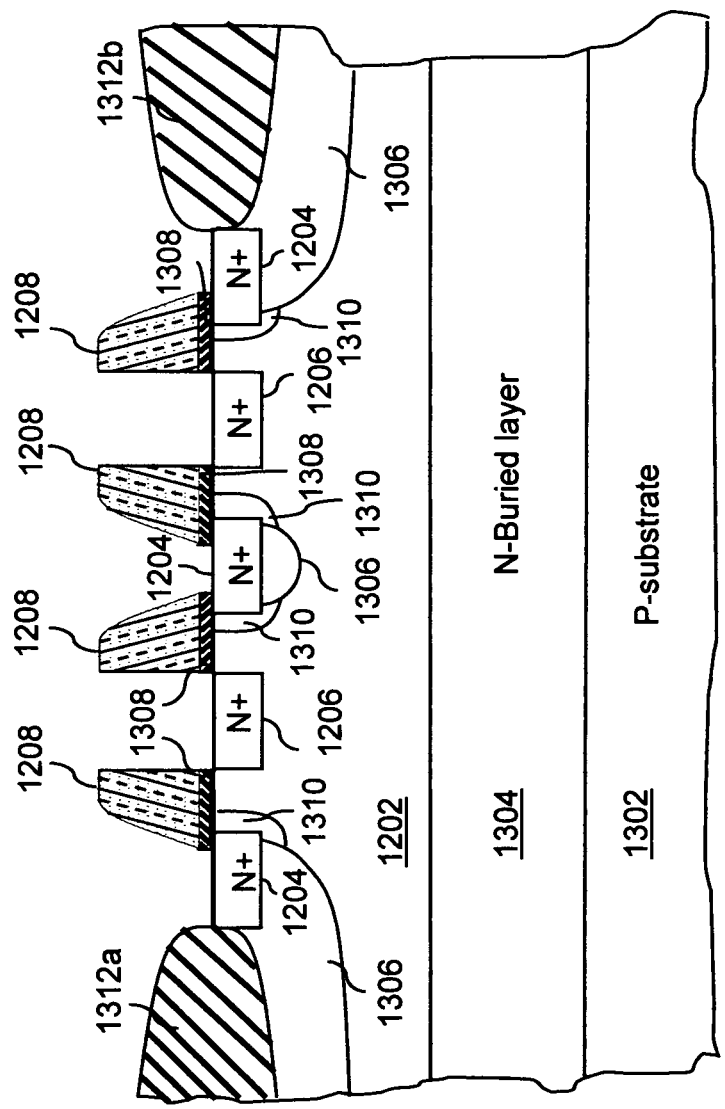
FIG. 13 illustrates a cross-sectional view of the power FET taken along line A-A in FIG. 12, in accordance with an embodiment of the present invention.

FIGS. 12 and 13 illustrate, respectively, a top view and a cross-sectional view taken along line A-A', of a power FET 1200 with frame gate structure, in accordance with an embodiment of the present invention. Power FET 1200 includes an n-type epitaxial layer 1202 formed over a p-type substrate 1302. In accordance with an embodiment of the invention, n-type epitaxial layer 1202 is separated from p-type substrate 1302 by an n-type buried layer 1304, which is more heavily doped than n-type epitaxial layer 1202.

Power FET 1200 further includes a plurality of source regions 1204 and a plurality of drain regions 1206. Source regions 1204 and drain regions 1206 are of n-type conductivity and are formed by using the same or similar fabrication process as described in conjunction with FIG. 3 for LDMOS transistor 200. Power FET 1200 also includes a plurality of p-wells 1306 that are formed in n-type epitaxial layer 1202. Each p-well of the plurality of p-wells 1306 in power FET 1200 is similar to p-well 210 of LDMOS transistor 200 and is formed by using the same or similar fabrication process. Similar to LDMOS transistor 200, each source region of power FET 1200 is partially in p-wells 1306 (as shown in FIG. 13), and partially underneath the one or more asymmetrical conductive spacers of a plurality of asymmetrical conductive spacers 1208. The plurality of asymmetrical conductive spacers 1208 act as a gate of power FET 1200 and are insulated from-type epitaxial layer 1202 by a dielectric layer 1308, typically made of $SiO_2$. Similar to asymmetrical conductive spacer 214 of LDMOS transistor 200, the height of each of the plurality of asymmetrical conductive spacers 1208 of power FET 1200 increases from a source region to a drain region.

In accordance with an embodiment of the present invention, the plurality of asymmetrical conductive spacers 1208 are connected in pairs in a row (as shown in FIG. 12) and each pair forms a frame structure 1210 outside active region of power FET 1200. The plurality of asymmetrical conductive spacers 1208 are connected in pairs in a row to reduce the effective width "W" of the channel of power FET 1200, thereby reducing parasitic capacitance and channel resistance of power FET 1200. Further, each pair of the asymmetrical conductive spacers is connected to other pairs through a conductive material 1214 outside the structure of the power FET, i.e., outside n-type epitaxial layer 1202.

Those ordinarily skilled in the art will appreciate that when a gate is connected in a frame structure or "folded", the effective width of the channel gets divided by the number of folds. For example, in the embodiment shown in FIG. 12 the effective channel width is one fourth of what it would have been if the gates were not folded or connected in the frame structure.

Conductive material 1214 can be made of, for example, polysilicon or any metal such as $WSi_x$. Since effectively all the asymmetrical conductive spacers of power FET 1200 are connected to each other through conductive material 1214, a gate contact (not shown) of power FET 1200 can be provided on conductive material 1214.

Power FET 1200 also includes a plurality of channel regions 1310 formed underneath the plurality of asymmetrical conductive spacers 1208. Similar to channel region 218 of LDMOS transistor 200, each channel region of the plurality of channel region 1310 is of p-type conductivity and is essentially completely under an asymmetrical conductive spacer of power FET 1200. As already described in conjunction with FIG. 3, the channel region underneath the asymmetrical conductive spacer is formed by performing ion-implantation on the asymmetrical conductive spacer, and the dopant used for implantation is similar to that used in the formation of a p-well.

Apart from the components described above, power FET 1200 also includes field oxide layers 1312a and 1312b that surround its active region, and a plurality of drift regions (not shown), formed between the plurality of channel regions 1310 and the plurality of drain regions 1206 when a positive gate voltage is applied on conductive material 1214.

Various embodiments of the present invention provide several advantages. The length "L" of the channel region of LDMOS transistor, according to an embodiment of the present invention, is much shorter than the length of the channel region of the prior art LDMOS transistors. This leads to lower channel resistance and parasitic capacitance. Further, the preferred embodiment of the present invention involves forming a "frame gate structure" of asymmetric conductive spacers (acting as the gate) of a power FET. This results in reduced width "W" of the channel and hence further decreases the channel resistance and parasitic capacitance.

While the preferred embodiments of the invention have been illustrated and described, it will be clear that the invention is not limited to these embodiments only. Numerous modifications, changes, variations, substitutions and equivalents will be apparent to those skilled in the art without departing from the spirit and scope of the invention as described in the claims.

What is claimed is:

1. A laterally diffused metal oxide semiconductor (LDMOS) transistor comprising:
   a semiconductor layer of a first conductivity type formed over a semiconductor substrate;
   an asymmetric conductive spacer formed over the semiconductor layer, the asymmetric conductive spacer acting as a gate of the LDMOS transistor and being insulated from the semiconductor layer by a dielectric layer, wherein the asymmetric conductive spacer divides the semiconductor layer into a first region and a second region, and wherein a height of the asymmetric conductive spacer near the first region is less than the height near the second region;
   a well of a second conductivity type formed in the first region;
   a source region of the first conductivity type formed in the first region, the source region being partially in the well of the second conductivity type and partially underneath the asymmetric conductive spacer;
   a drain region of the first conductivity type formed in the second region; and
   a channel region of the second conductivity type formed in the semiconductor layer, the channel region being an implanted region formed under the asymmetric conductive spacer near the first region and being formed essentially completely under the asymmetric conductive spacer, the channel region having a depth that is greatest near the first region and decreases away from the first region.

2. The LDMOS transistor of claim 1, wherein the channel region and the drain region are separated by a drift region of the first conductivity type.

3. The LDMOS transistor of claim 1 further comprising a field oxide layer surrounding an area of the semiconductor layer where the LDMOS transistor is fabricated.

4. The LDMOS transistor of claim 1, wherein the semiconductor layer is an epitaxial layer of the first conductivity type.

5. The LDMOS transistor of claim 1, wherein the first conductivity type is N-type and the second conductivity type is P-type.

6. A power field effect transistor (FET) comprising:
   a semiconductor layer of a first conductivity type formed over a semiconductor substrate;
   a plurality of asymmetric conductive spacers formed over the semiconductor layer, the plurality of asymmetric conductive spacers acting as a gate of the power FET and being insulated from the semiconductor layer by a dielectric layer, wherein a height of each asymmetric conductive spacer of the plurality of asymmetric conductive spacers increases from a source region to a drain region of the power FET;
   a plurality of wells of a second conductivity type formed in the semiconductor layer;
   a plurality of source regions of the first conductivity type, wherein one source region of the plurality of source regions of the power FET is partially in one well of the plurality of wells of the second conductivity type and partially underneath one or more asymmetric conductive spacers of the plurality of asymmetric conductive spacers;
   a plurality of drain regions of the first conductivity type formed in the semiconductor layer;
   a plurality of channel regions of the second conductivity type formed in the semiconductor layer corresponding to the plurality of asymmetric conductive spacers, each channel region of the plurality of channel regions being essentially completely under an asymmetric conductive spacer of the power FET,
   wherein adjacent asymmetric conductive spacers in the plurality of asymmetric conductive spacers are connected in pairs to form a plurality of pairs of asymmetric conductive spacers, each pair of asymmetric conductive spacers from the plurality of pairs of asymmetric conductive spacers forming a frame structure outside an active region of the power FET, and wherein the pairs of asymmetric conductive spacers are connected to each other through a conductive material outside the semiconductor layer.

7. The power FET of claim 6, wherein the plurality of channel regions and the plurality of drain regions are separated by a plurality of drift regions of the first conductivity type.

8. The power FET of claim 6 further comprising a field oxide layer surrounding the active region of the power FET.

9. The power FET of claim 6, wherein the first conductivity type is N-type and the second conductivity type is P-type.

* * * * *